(12) United States Patent
Yasunaga (10) Patent No.: US 12,068,236 B2
(45) Date of Patent: Aug. 20, 2024

(54) ELECTRONIC MODULE

(71) Applicant: Murata Manufacturing Co., Ltd., Nagaokakyo (JP)

(72) Inventor: Shoji Yasunaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 331 days.

(21) Appl. No.: 17/539,321

(22) Filed: Dec. 1, 2021

(65) Prior Publication Data
US 2022/0093502 A1    Mar. 24, 2022

Related U.S. Application Data

(63) Continuation of application No. PCT/JP2020/022599, filed on Jun. 9, 2020.

(30) Foreign Application Priority Data

Jun. 24, 2019 (JP) ................. 2019-116764

(51) Int. Cl.
| | | |
|---|---|---|
| *H01L 23/50* | (2006.01) | |
| *H01L 23/29* | (2006.01) | |
| *H01L 23/367* | (2006.01) | |
| *H01L 23/373* | (2006.01) | |
| *H01L 23/498* | (2006.01) | |

(52) U.S. Cl.
CPC ............ *H01L 23/50* (2013.01); *H01L 23/293* (2013.01); *H01L 23/367* (2013.01); *H01L 23/3736* (2013.01); *H01L 23/49811* (2013.01); *H01L 23/49866* (2013.01)

(58) Field of Classification Search
CPC ..... H01L 23/50; H01L 23/293; H01L 23/367; H01L 23/3736; H01L 23/49811; H01L 23/49866
See application file for complete search history.

(56) References Cited

U.S. PATENT DOCUMENTS

2007/0096160 A1* 5/2007 Beroz ............... H01L 23/49861
257/E23.036
2011/0037170 A1 2/2011 Shinohara

FOREIGN PATENT DOCUMENTS

| JP | 2005-093872 A | 4/2005 |
| JP | 2011-040602 A | 2/2011 |
| JP | 2014-239379 A | 12/2014 |

OTHER PUBLICATIONS

Official Communication issued in International Patent Application No. PCT/JP2020/022599, mailed on Sep. 1, 2020.

* cited by examiner

*Primary Examiner* — Peniel M Gumedzoe (74) *Attorney, Agent, or Firm* — Keating & Bennett, LLP (57) ABSTRACT

An electronic module includes a wiring board including a lower surface on which a second electrode pad including a bonding surface is located, a lead electrically connected to the second electrode pad with solder therebetween, and a sealer to seal the lead. The lead includes an exposed section exposed to outside the sealer and a main body section extending from the exposed section toward the wiring board and including a tip end portion near the wiring board. The tip end portion is connected to the second electrode pad with the solder therebetween. A thickness of the solder between a tip end surface of the tip end portion and the bonding surface of the second electrode pad in a direction orthogonal or substantially orthogonal to the bonding surface is non-uniform.

20 Claims, 7 Drawing Sheets

ELECTRONIC MODULE

CROSS REFERENCE TO RELATED APPLICATIONS

This application claims the benefit of priority to Japanese Patent Application No. 2019-116764 filed on Jun. 24, 2019 and is a Continuation Application of PCT Application No. PCT/JP2020/022599 filed on Jun. 9, 2020. The entire contents of each application are hereby incorporated herein by reference.

BACKGROUND OF THE INVENTION

1. Field of the Invention

The present disclosure relates to electronic modules.

2. Description of the Related Art

An example of an electronic module in which an electronic component and leads are mounted on a wiring board and are sealed by a sealer, such as a resin, is disclosed in Japanese Unexamined Patent Application Publication No. 2011-40602. The electronic module in Japanese Unexamined Patent Application Publication No. 2011-40602 includes the wiring board with a plurality of electrode pads on its lower surface, the leads electrically connected to the electrode pads, and the sealer that seals the leads. Each of the leads is formed by bending a conductive metal plate and includes a first portion extending in parallel with the lower surface of the wiring board, a second portion extending from an end portion of the first portion in a direction crossing the lower surface of the wiring board, and a third portion extending from an end portion of the second portion in a direction extending in parallel with the first portion. The first portion is connected to the electronic pad with a conductive binder, such as solder, disposed therebetween. An upper surface and a side surface of the third portion are exposed through a principal surface and a side surface of the sealer, respectively. Thus, the lead functions as an external connection terminal for connecting the electronic module to another electronic module outside it.

In producing electronic modules, the leads are connected to the wiring board by reflowing. In that process, after solder paste is applied to the electrode pads, a collective board on which the plurality of leads are formed in predetermined positions is placed on the lower surface of the wiring board, and the solder paste is melted by heat treatment and solidified, thus connecting the leads to the electrode pads.

When the solder paste is melted at the time of connecting the leads by reflowing, the melted solder between the electrode pad and the first portion is forced out by the weight of the collective board of the leads. At that time, in the above-described known configuration, because the first portion connected to the electrode pad extends in parallel with the lower surface of the wiring board, the entirety of the solder between the electrode pad and the first portion tends to be thinned, and a problem arises in that the strength of bonding of the leads decreases.

Such a problem may occur in not only the case where the leads are connected to the wiring board by reflowing by the use of the collective board, but also cases where the leads are connected to the wiring board by other methods.

SUMMARY OF THE INVENTION

Preferred embodiments of the present invention provide electronic modules that are each able to reduce or prevent a decrease in the strength of bonding of a lead to a wiring board.

An electronic module according to a preferred embodiment of the present disclosure includes a wiring board including a principal surface on which an electrode pad including a bonding surface is located, a lead electrically connected to the electrode pad with a conductive binder disposed therebetween, and a sealer to seal the lead. The lead includes an exposed section exposed to outside the sealer and a main body section extending from the exposed section toward the wiring board and including a tip end portion near the wiring board. The tip end portion is connected to the electrode pad with the binder therebetween. A thickness of the binder between a tip end surface of the tip end portion and the bonding surface of the electrode pad in a direction orthogonal or substantially orthogonal to the bonding surface is non-uniform.

In the above-described configuration, because the thickness of the binder is non-uniform, if the melted binder between the electrode pad and the tip end portion in the main body section is forced out by, for example, the weight of the lead at the time of connecting the lead, unlike a case where the solder is forced out from between two parallel or substantially parallel surfaces, a state where the entirety or substantially the entirety of the binder between the bonding surface of the electrode pad and the tip end surface is thinned can be reduced or prevented. Thus, the decrease in the strength of bonding of the lead to the wiring board is able to be reduced or prevented.

According to preferred embodiments of the present disclosure, the decrease in the strength of bonding of the lead to the wiring board is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described below with reference to the drawings.

Figure 1:
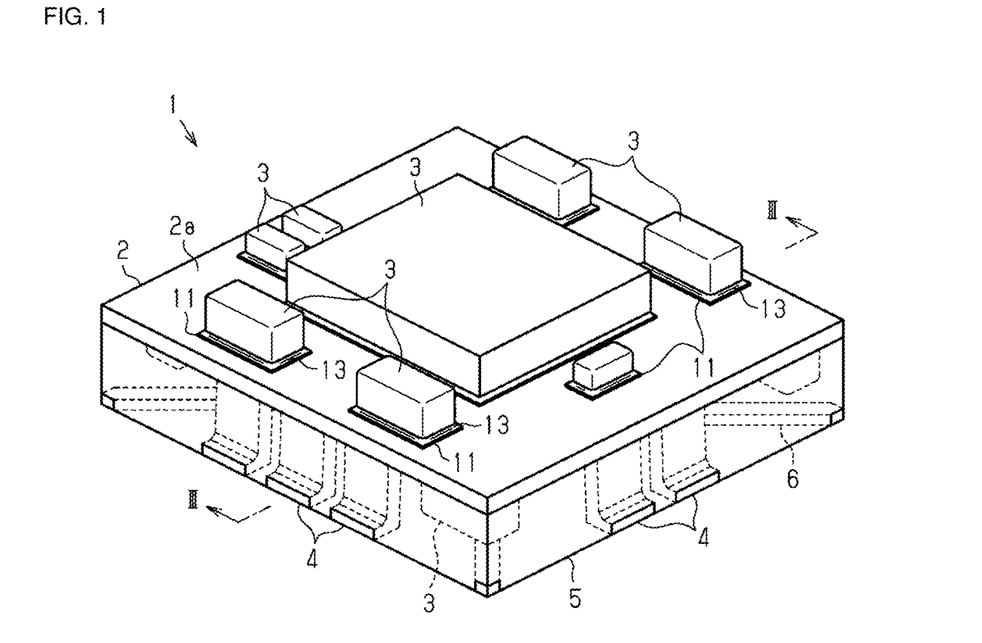
FIG. 1 is a perspective view of an electronic module as seen from an upper surface side of a wiring board according to a preferred embodiment of the present invention.
Figure 2:
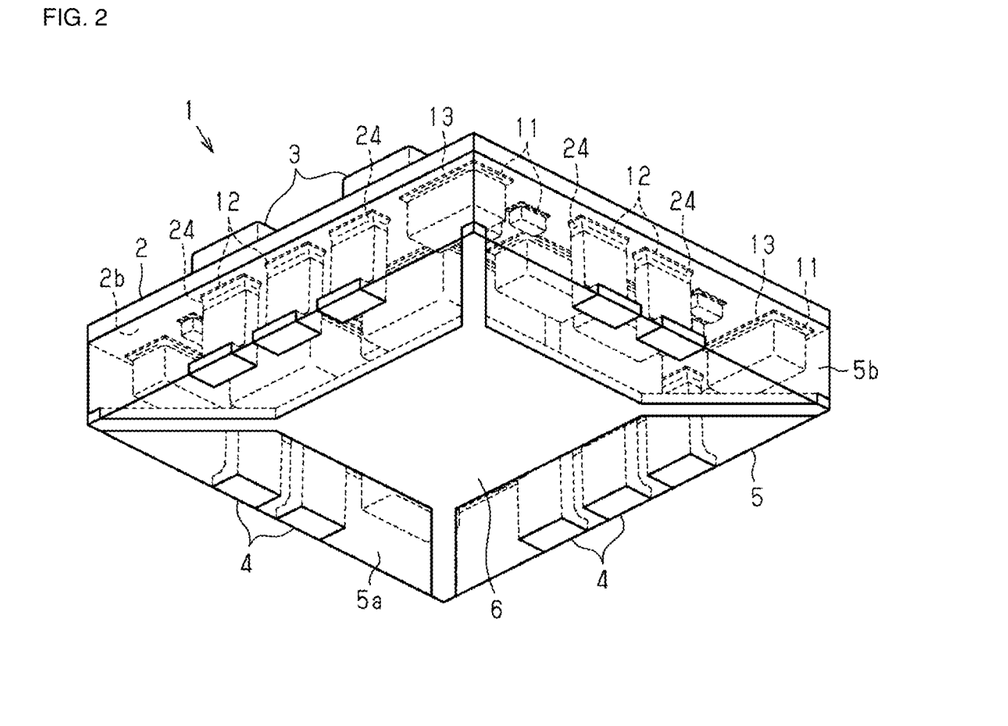
FIG. 2 is a perspective view of an electronic module as seen from a lower surface side of a wiring board according to a preferred embodiment of the present invention.
Figure 3:
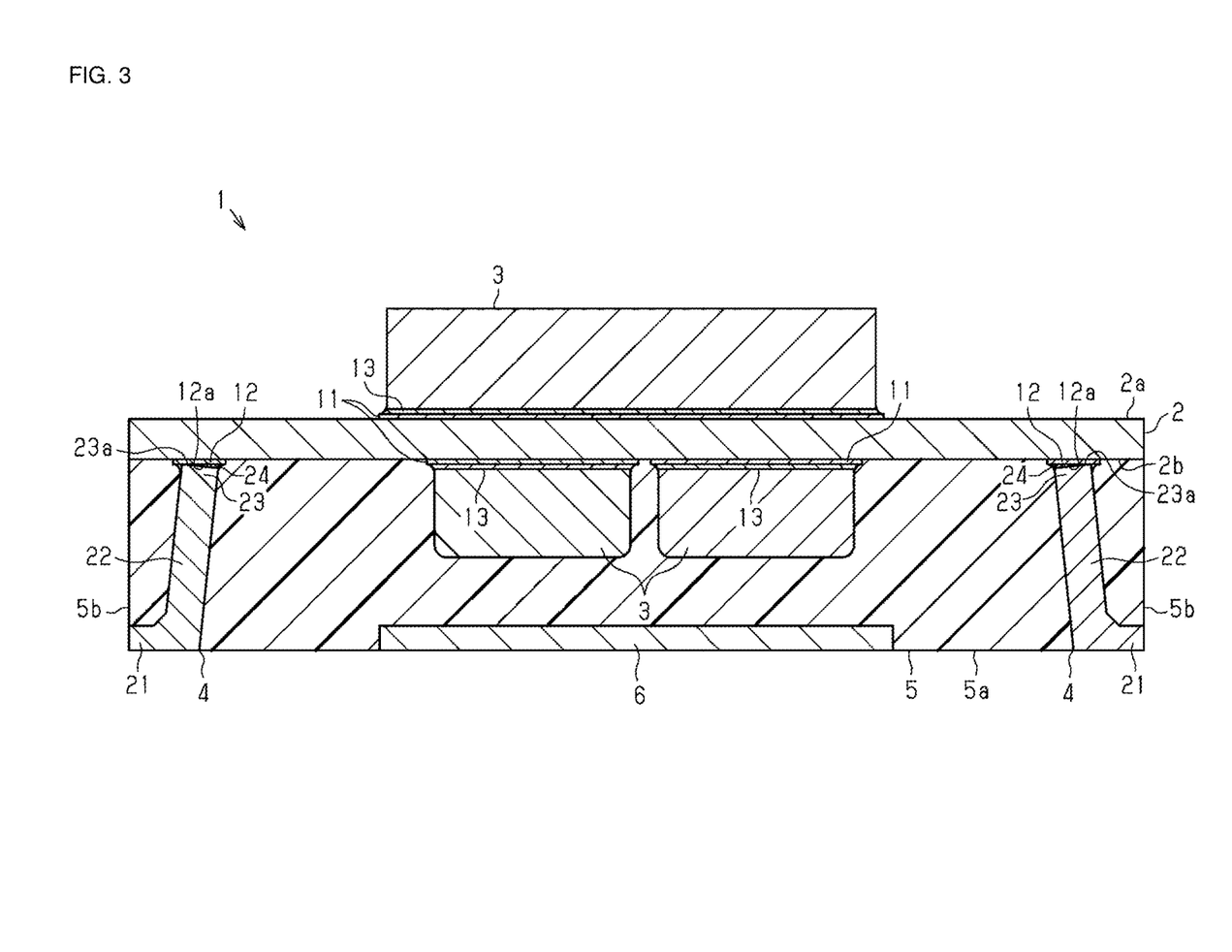
FIG. 3 is a cross-sectional view of an electronic module according to a preferred embodiment of the present invention and is a cross-sectional view taken along the line in FIG. 1.

As illustrated in FIGS. 1 to 3, an electronic module 1 includes a wiring board 2, a plurality of electronic components 3 and a plurality of leads 4 mounted on the wiring board 2, a sealer 5 sealing the electronic components 3 and leads 4, and a heat sink 6 embedded in the sealer 5.

The wiring board 2 has a rectangular or substantially rectangular plate shape. A plurality of first electrode pads 11 are disposed on an upper surface 2a of the wiring board 2, and a plurality of first electrode pads 11 and a plurality of second electrode pads 12 are disposed on a lower surface 2b as a principal surface of the wiring board 2. The first electrode pads 11 are junctions to which the electronic components 3 are electrically connected and are in predetermined designated positions on the upper surface 2a and lower surface 2b. The second electrode pads 12 are junctions to which the leads 4 are electrically connected and are in predetermined designated positions on the lower surface 2b.

The second electrode pads 12 according to the present preferred embodiment have an oblong shape. The second electrode pads 12 are aligned on the lower surface 2b, and their longitudinal directions extend along the outer edge of the wiring board 2. A bonding surface 12a of each of the second electrode pads 12 has a flat shape with no asperities.

Via electrodes and wiring not illustrated are disposed on the wiring board 2 and electrically connect the designated electronic components 3 and leads 4 mounted on the first electrode pads 11 and second electrode pads 12. As the wiring board 2 according to the present preferred embodiment, a resin board made of, for example, a resin material, such as polychlorinated biphenyl, or a ceramic board made of a ceramic material, such as a low temperature co-fired ceramic material, can be used. The wiring board 2 may be a single-layer board or a multilayer board. The zone other than the first electrode pads 11 and the second electrode pads 12 on the upper surface 2a and lower surface 2b is overlaid with a resist layer, not illustrated.

The plurality of electronic components 3 include chip components, such as capacitors, inductors, and resistors, and semiconductor devices and the like, for example. Each of the electronic components 3 is connected to the designated first electrode pad 11 corresponding to the type of the electronic component 3 with solder 13 as a conductive binder disposed therebetween.

Each of the plurality of leads 4 has a plate shape in which a plate of metal, such as copper, for example, is bent. The lead 4 includes an exposed section 21 exposed to outside the sealer 5 and a main body section 22 extending from the exposed section 21 toward the side where the wiring board 2 is positioned and including a tip end portion 23 near the wiring board 2. The tip end portion 23 in the lead 4 is connected to the second electrode pad 12 with solder 24 as a conductive binder disposed therebetween. The lead 4 is connected to the second electrode pad 12 in an orientation in which its direction orthogonal or substantially orthogonal to its plate thickness direction extends along the outer edge of the wiring board 2, that is, along the longitudinal direction of the second electrode pad 12. The height of the lead 4 from the lower surface 2b of the wiring board 2 is larger than the height of the electronic component 3 mounted on the lower surface 2b.

Figure 4:
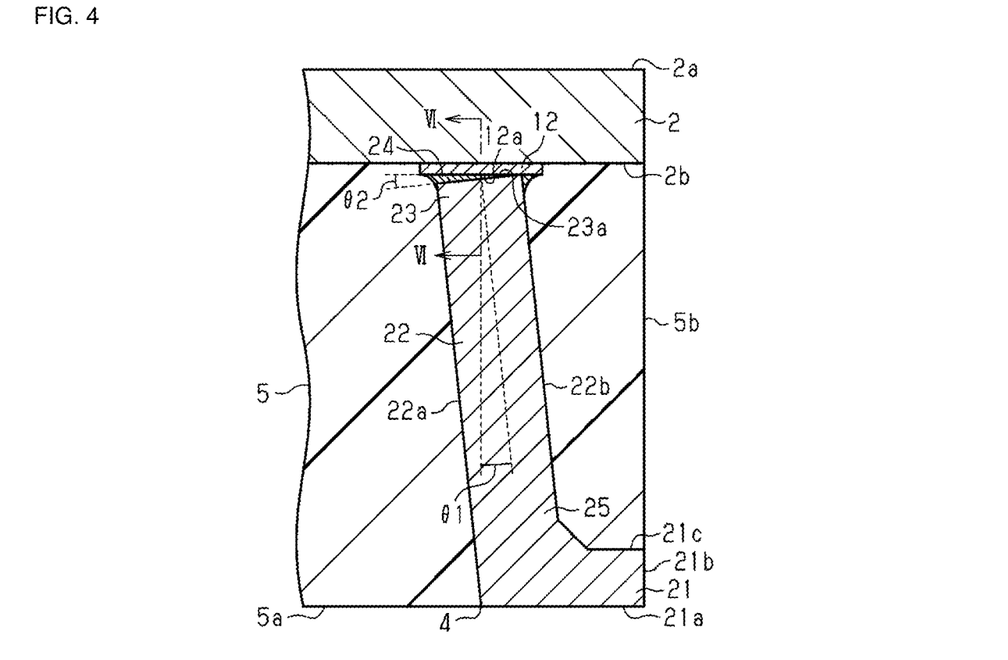
FIG. 4 is an enlarged cross-sectional view of surroundings of a lead in an electronic module according to a preferred embodiment of the present invention.

As illustrated in FIG. 4, the exposed section 21 has a planar shape in which it is continuous with a base end portion 25 in the main body section 22 opposite to the lower surface 2b and it is bent at an obtuse angle to the main body section 22 toward the side where the wiring board 2 is positioned. Specifically, the exposed section 21 has a planar shape in which it is bent in parallel or substantially in parallel with the wiring board 2 with respect to the main body section 22. An upper surface 21a and a side surface 21b of the exposed section 21 are exposed through the sealer 5.

The main body section 22 has a planar shape in which it linearly extends in a direction tilted with respect to the bonding surface 12a of the second electrode pad 12. An angle θ1 between the direction in which the main body section 22 extends and the normal to the bonding surface 12a may preferably be no more than 30 degrees, for example. When θ1 is not more than 30 degrees, an excessive increase in the area where the leads 4 are mounted on the wiring board 2 can be prevented, and a high degree of integration in the electronic module 1 can be achieved. A tip end surface 23a of the tip end portion 23 facing the bonding surface 12a of the second electrode pad 12 is configured such that the thickness of the solder 24 between the tip end surface 23a and the bonding surface 12a orthogonal or substantially orthogonal to the bonding surface 12a is non-uniform. That is, the tip end surface 23a is configured such that the thickness of the solder 24 in the direction orthogonal or substantially orthogonal to the bonding surface 12a is non-uniform.

Specifically, the tip end surface 23a has an oblong shape at right angles or substantially right angles to an upper surface 22a of the main body section 22 continuous with the upper surface 21a of the exposed section 21 and to a lower surface 22b of the main body section 22 continuous with a lower surface 21c of the exposed section 21. The upper surface 22a and the lower surface 22b of the main body section 22 are parallel or substantially parallel with each other. The tip end surface 23a is tilted away from the bonding surface 12a such that the distance between the tip end surface 23a and the bonding surface 12a gradually increases in the direction from the side continuous with the lower surface 22b toward the side continuous with the upper surface 22a. In other words, the tip end surface 23a is tilted with respect to the bonding surface 12a such that the thickness of the solder 24 gradually increases in the direction from the side where the exposed section 21 is positioned toward the side opposite to the exposed section 21 in the tip end surface 23a. The thickness of the solder 24 may be zero or more than zero at the end portion in the tip end surface 23a on the side continuous with the lower surface 22b. That is, the end portion in the tip end surface 23a on the side continuous with the lower surface 22b may or may not be in contact with the bonding surface 12a. In addition, an angle θ2 between the tip end surface 23a and the bonding surface 12a is equal or substantially equal to the angle θ1 between the direction in which the main body section 22 extends and the normal to the bonding surface 12a.

Figure 5A:
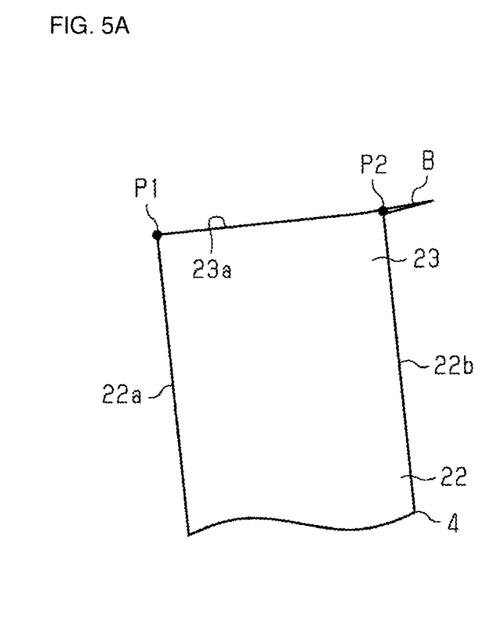
FIGS. 5A and 5B are schematic views illustrating definitions of a tip end surface.
Figure 5B:
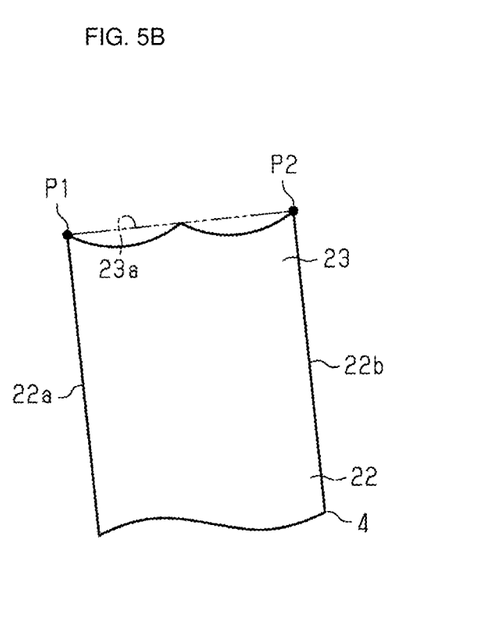

Here, as illustrated in FIGS. 5A and 5B, because the tip end surface 23a may not have a flat shape in a strict sense, depending on the method of producing the lead 4, the tip end surface 23a is defined as described below. As described below, if a lead material section 43 to become the lead 4 is formed from a metal plate by punching, as illustrated in FIG. 5A, for example, a burr B may be produced in the tip end surface 23a. In that case, a straight line connecting a tip end position P1 of the upper surface 22a and a tip end position P2 of an imaginary lower surface 22b linearly extended from the lower surface 22b while the burr B is ignored is defined as the line indicating a cross section of the tip end surface 23a. If the lead material section 43 to become the lead 4 is formed by melting the metal plate by etching, as illustrated in FIG. 5B, for example, the tip end surface 23a is a curved surface. In that case, a straight line connecting the tip end position P1 of the upper surface 22a and the tip end position P2 of the lower surface 22b is defined as the line indicating a cross section of the tip end surface 23a.

Because the lead 4 according to the present preferred embodiment is formed by bending the lead material section 43, as described below, the tip end surface 23a may be tilted in which the portion of the tip end surface 23a continuous with the lower surface 22b protrudes. Thus, even when the angle θ2 between the tip end surface 23a and the bonding surface 12a is designed to be equal or substantially equal to the above angle θ1, the angle θ2 may be larger than the angle θ1 by the order of a few degrees.

Figure 6:
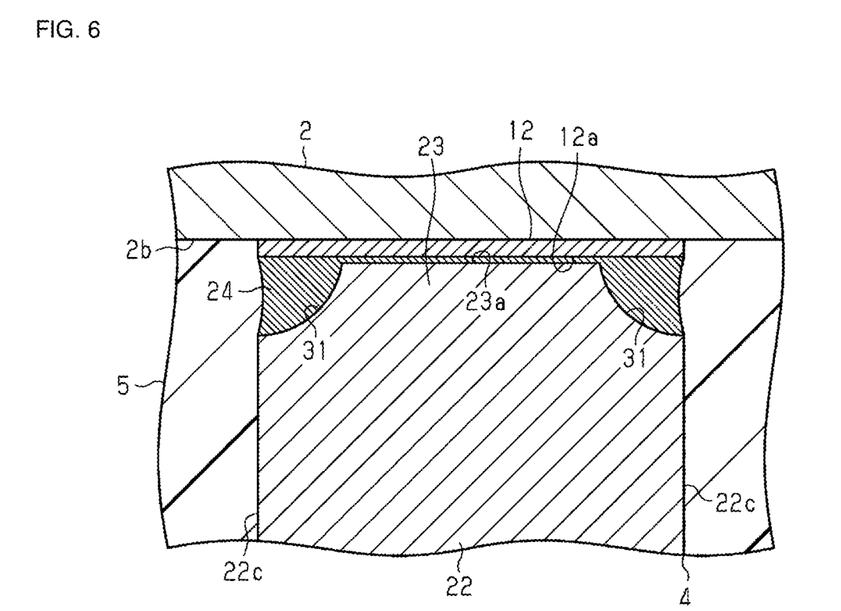
FIG. 6 is a cross-sectional view orthogonal or substantially orthogonal to a plate thickness direction of the lead in the electronic module according to a preferred embodiment of the present invention and is a cross-sectional view taken along the line VI-VI in FIG. 4.

As illustrated in FIG. 6, the tip end portion 23 includes cut regions 31 cut in the tip end surface 23a and side surfaces 22c of the main body section 22. The side surfaces 22c are surfaces on the opposite sides orthogonal or substantially orthogonal to the plate thickness direction of the main body section 22 and are orthogonal or substantially orthogonal to the upper surface 22a and the lower surface 22b. The tip end portion 23 according to the present preferred embodiment includes the cut regions 31 on the opposite sides in the direction orthogonal or substantially orthogonal to the plate thickness direction. Each of the cut regions 31 extends through the tip end portion 23 in the plate thickness direction and has a fan shape as seen from the plate thickness direction. The solder 24 spreads out into the cut region 31 and provides a fillet.

As illustrated in FIGS. 2 and 3, the sealer 5 is made of an insulating resin material, such as epoxy resin, for example. The sealer 5 covers the entirety or substantially the entirety of the lower surface 2b of the wiring board 2, has a cuboid shape including a principal surface 5a flush with the upper surfaces 21a of the exposed sections 21 and side surfaces 5b flush with the side surfaces 21b, and seals the entirety or substantially the entirety of the electronic components 3 therein. Thus, the upper surfaces 21a and the side surfaces 21b of the exposed sections 21 are exposed through the sealer 5. In mounting the electronic module 1 on other wiring board or the like, the upper surfaces 21a and the side surfaces 21b are connected to the other wiring board with a conductive binder disposed therebetween. That is, the leads 4 define and function as outer connection terminals to connect the electronic module 1 to other external electronic module or the like.

The heat sink 6 is made of a metal material, such as copper, for example. The heat sink 6 has an oblong plate shape smaller than the wiring board 2 and includes leg sections radially extending from its four corners. The heat sink 6 is embedded in the sealer 5 such that it is flush with the principal surface 5a of the sealer 5.

Next, a non-limiting example of production of the electronic module 1 according to the present preferred embodiment is described with emphasis on forming of the leads 4. Here, for the sake of convenience of explanation, production of two electronic modules 1 at a time is described. In a similar manner, the electronic modules 1 can be produced one by one or the three or more electronic modules 1 can be produced at a time.

Figure 7:
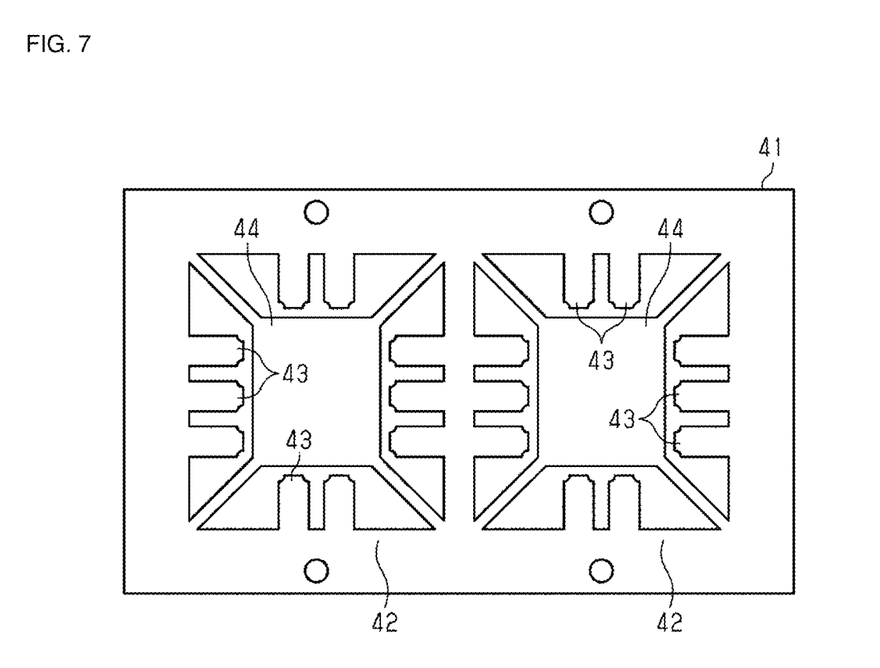
FIG. 7 is a plan view of a collective board before leads are provided according to a preferred embodiment of the present invention.

As illustrated in FIG. 7, the leads 4 are produced by using a collective board 41 made of a plate of metal, such as copper, for example. The collective board 41 includes frame sections 42 of the same number as the electronic modules 1 to be produced at a time. Each of the frame sections 42 has a rectangular or substantially rectangular frame shape corresponding to the wiring board 2. The neighboring frame sections 42 include a shared side. The collective board 41 includes the lead material sections and heat sink material sections 44 connected to the frame sections 42. The lead material sections 43 of the same number as the leads 4 included in the electronic module 1 to be produced are disposed on the frame sections 42 in the positions corresponding to the second electrode pads 12 on the wiring board 2. Each of the lead material sections 43 has a long narrow plate shape, and its tip end portion includes a cut region of the same shape as the cut region 31 in the lead 4. Each of the heat sink material sections 44 has the same or substantially the same shape as that of the heat sink 6.

The collective board 41 is produced by forming the frame sections 42, lead material sections 43, and heat sink material sections 44 by performing punching or etching on a single metal plate, for example.

Figure 8:
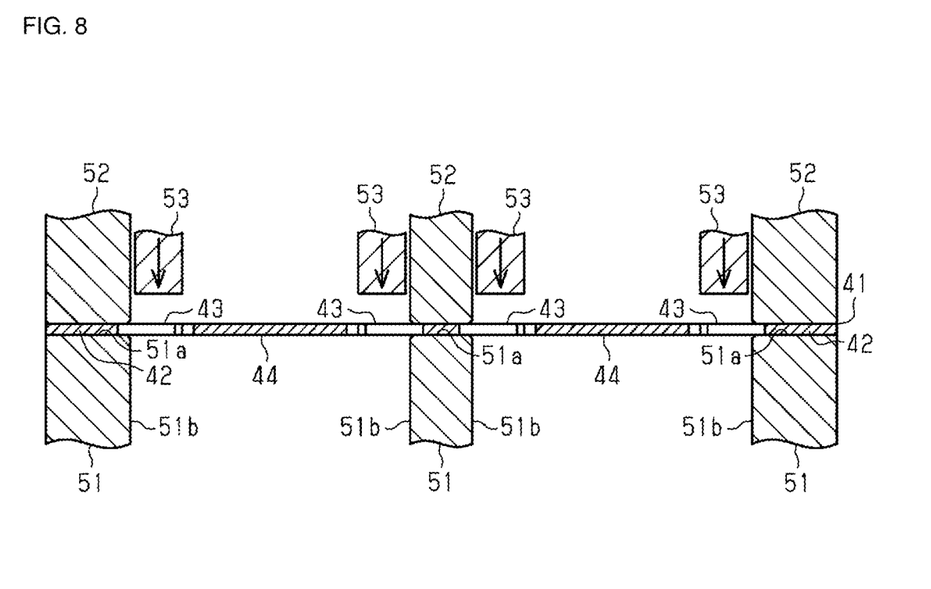
FIG. 8 is a cross-sectional view of a collective board disposed on dies before leads are provided according to a preferred embodiment of the present invention.

Subsequently, as illustrated in FIG. 8, the collective board 41 is placed on support dies 51, is pressed by holding dies 52, and is sandwiched therebetween. Each of the support dies 51 has a rectangular or substantially rectangular frame shape, as in the case of each of the frame sections 42. The support die 51 includes a placement surface 51a to enable the collective board 41 to be placed thereon, the placement surface 51a has a flat shape with no asperities, and the width of the placement surface 51a is larger than that of the frame section 42. Thus, the placement surface 51a is in contact with the entirety or substantially the entirety of the frame section 42 and base end portions of the lead material sections 43. The support die 51 includes side surfaces 51b having a flat shape at right angles to the placement surface 51a. The holding die 52 has the same or substantially the same shape as that of the support die 51. In a state where the collective board 41 is placed on the placement surface 51a and pressed by the holding die 52 and the collective board 41 is sandwiched therebetween, portions of the lead material sections 43 protruding from the placement surface 51a are bent along the side surfaces 51b by pressing using press dies 53 made from punches or the like.

Figure 9:
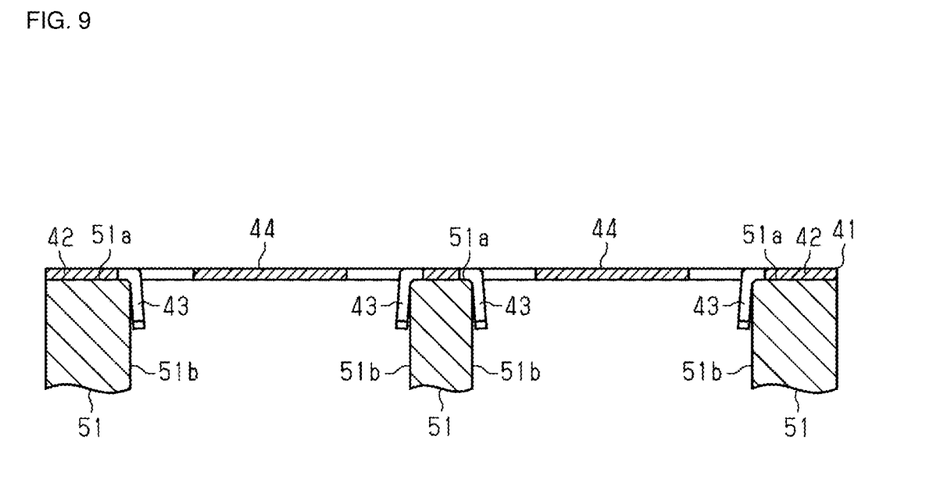
FIG. 9 is a cross-sectional view of a collective board disposed on the dies after leads are provided according to a preferred embodiment of the present invention.

In that way, as illustrated in FIG. 9, in the state where the base end portion of each of the lead material sections 43 remains in parallel or substantially in parallel with the frame section 42, the tip end side of the lead material section 43 is bent. At that time, because an elastic deformation component of the tip end side of the lead material section 43 is restored, the tip end side is tilted at an obtuse angle to the base end portion. After the lead material section 43 is separated from the frame section 42, the base end portion is the exposed section 21, and the bent tip end side portion is the main body section 22.

Figure 10:
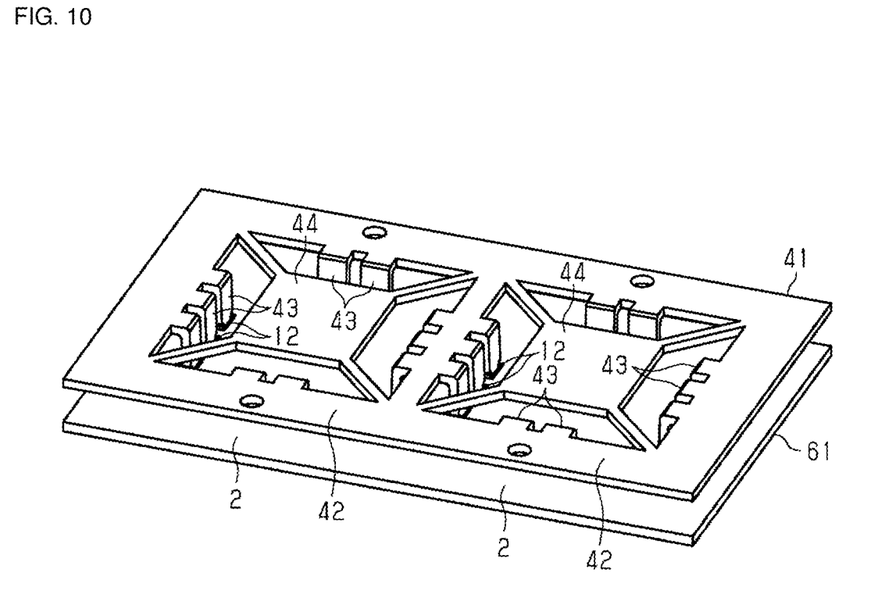
FIG. 10 is a perspective view of a collective board of leads disposed on a board parent body according to a preferred embodiment of the present invention.

Subsequently, as illustrated in FIG. 10, the collective board 41 is connected to a board parent body 61. The board parent body 61 is the one in which the wiring boards 2 of the same number as the electronic modules 1 to be produced at a time are integrated. In connecting the collective board 41 to the wiring boards 2, first, solder paste is applied on the second electrode pads 12 on the wiring boards 2, and the collective board 41 is placed on the board parent body 61 such that the tip end portions of the lead material sections 43, that is, the tip end portions 23 of the leads 4 are arranged on the corresponding second electrode pads 12. The electronic components 3 may be mounted before the collective board 41 is placed on the board parent body 61 or may be mounted after the collective board 41 is connected to the board parent body 61. The lead material sections 43 are connected to the second electrode pads 12 by melting the solder paste by heat treatment and then solidifying it. After that, the sealer 5 is formed, the lead material sections 43 and the heat sink material sections 44 are separated from the frame sections 42, the wiring boards 2 are separated from the board parent body 61, and then the electronic modules 1 are produced.

Next, the actions and advantages of the present preferred embodiment are described.

(1) The lead 4 includes the exposed section 21 exposed to outside the sealer 5 and the main body section 22 extending from the exposed section 21 toward the wiring board 2 and including the tip end portion 23 near the wiring board 2. The tip end portion 23 of the main body section 22 on the side where the wiring board 2 is positioned is connected to the second electrode pad 12 with the solder 24 disposed therebetween. The tip end surface 23*a* of the tip end portion 23 is formed such that the thickness of the solder 24 between the tip end surface 23*a* and the bonding surface 12*a* of the second electrode pad 12 in the direction orthogonal or substantially orthogonal to the bonding surface 12*a* is non-uniform. Thus, if the melted solder 24 between the second electrode pad 12 and the tip end portion 23 is forced out by, for example, the weight of the collective board 41 at the time of connecting the lead 4, unlike a case where the solder is forced out from between two parallel or substantially parallel surfaces, a state where the entirety or substantially the entirety of the solder 24 between the bonding surface 12*a* and the tip end surface 23*a* is thinned can be reduced or prevented. Thus, the decrease in the strength of bonding of the lead 4 to the wiring board 2 can be reduced or prevented. In comparison with, for example, a case where the lead includes a portion extending in parallel or substantially in parallel with the bonding surface 12*a* and that portion is connected, the area where the lead 4 is mounted can be reduced by connecting the tip end surface 23*a* to the bonding surface 12*a*.

(2) The main body section 22 extends in the direction tilted with respect to the bonding surface 12*a*, the exposed section 21 is continuous with the base end portion 25 in the main body section 22 and is bent at an obtuse angle to the main body section 22 toward the side where the wiring board 2 is positioned. Thus, as in the present preferred embodiment, in producing the lead 4 by bending a portion of a metal plate by pressing or the like, the lead material section 43 after forming, that is, the lead 4 can be easily detached from the support die 51.

The tip end surface 23*a* is tilted with respect to the bonding surface 12*a* such that the thickness of the solder 24 between the tip end surface 23*a* and the bonding surface 12*a* gradually increases in the direction from the side where the exposed section 21 is positioned toward the side opposite to the exposed section 21 in the tip end surface 23*a*. Here, when the tip end surface 23*a* is a plane orthogonal or substantially orthogonal to the direction in which the main body section 22 extends, simply by arranging the lead 4 on the lower surface 2*b* such that the exposed section 21 is in an orientation parallel or substantially parallel with the wiring board 2, the tip end surface 23*a* is tilted with respect to the bonding surface 12*a* such that the gap between the tip end surface 23*a* and the bonding surface 12*a* gradually increases in the direction from the side where the exposed section 21 is positioned toward the side opposite to the exposed section 21. Accordingly, the thickness of the solder 24 between the tip end surface 23*a* and the bonding surface 12*a* can be made non-uniform without additional processing of, for example, forming asperities or the like in the tip end surface 23*a*, and thus the lead 4 can be easily produced.

(3) Because the angle θ2 between the bonding surface 12*a* and the tip end surface 23*a* is equal or substantially equal to the angle θ1 between the direction in which the main body section 22 extends and the normal to the bonding surface 12*a*, the degree of tilting of the tip end surface 23*a* with respect to the bonding surface 12*a* can be easily determined by observing the degree of tilting of the main body section 22 with respect to the second electrode pad 12.

(4) Because the tip end portion 23 includes the cut regions 31 cut in the side surfaces 22*c* and the tip end surface 23*a* of the main body section 22, the solder 24 spreads out into the cut regions 31 and forms a fillet, and thus the strength of bonding of the lead 4 to the wiring board 2 can be suitably improved. Because the fillet is formed inside the cut regions 31, the increase in the area where the lead 4 is mounted can be reduced or prevented, and a high degree of integration in the wiring board 2 can be achieved.

The present preferred embodiment can be changed as described below. The present preferred embodiment and variations below can be combined and provided within the range where no technical conflict occurs.

In the above-described preferred embodiment, the lead 4 has a plate shape. It is not limited thereto. One example shape may be a quadrangular prism shape, and that shape can be changed as needed. The lead 4 may not have a bent shape, and the base end portion 25 in the main body section 22 may be exposed to outside the sealer 5. In that case, the base end portion 25 defines and functions as the exposed section.

In the above-described preferred embodiment, the main body section 22 extends in the direction tilted with respect to the bonding surface 12*a*. It is not limited thereto. When the thickness of the solder 24 between the tip end surface 23*a* and the bonding surface 12*a* is non-uniform, the main body section 22 may extend in, for example, a direction orthogonal or substantially orthogonal to the bonding surface 12*a*.

Figure 11:
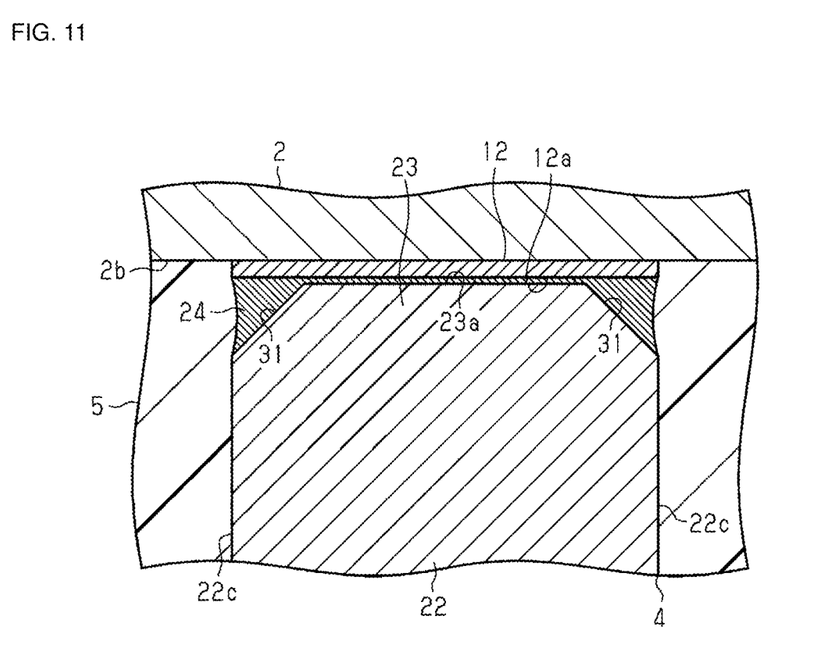
FIG. 11 is a cross-sectional view orthogonal or substantially orthogonal to the plate thickness direction of lead in an electronic module according to a variation of a preferred embodiment of the present invention.

In the above-described preferred embodiment, the cut region 31 has a fan shape. It is not limited thereto. As illustrated in FIG. 11, for example, it may have a triangular or substantially triangular shape. That shape may be changed as needed. The cut region 31 may be provided in the tip end portion 23 on only one side in the direction orthogonal or substantially orthogonal to the plate thickness direction. The tip end portion 23 may not include the cut regions 31.

In the above-described preferred embodiment, the angle θ2 between the bonding surface 12a and the tip end surface 23a may differ from the angle θ1 between the direction in which the main body section 22 extends and the normal to the bonding surface 12a.

Figure 12:
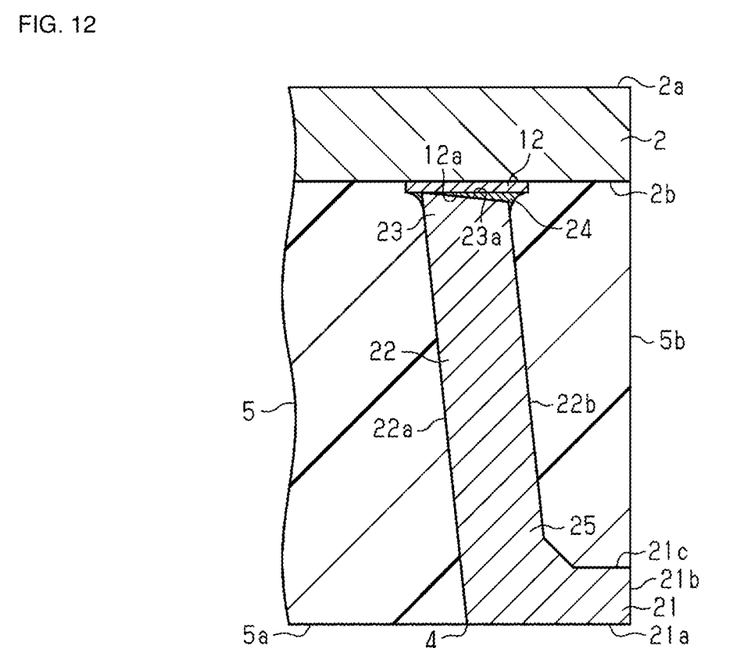
FIG. 12 is an enlarged cross-sectional view of surroundings of a lead in an electronic module according to another variation of a preferred embodiment of the present invention.
Figure 13:
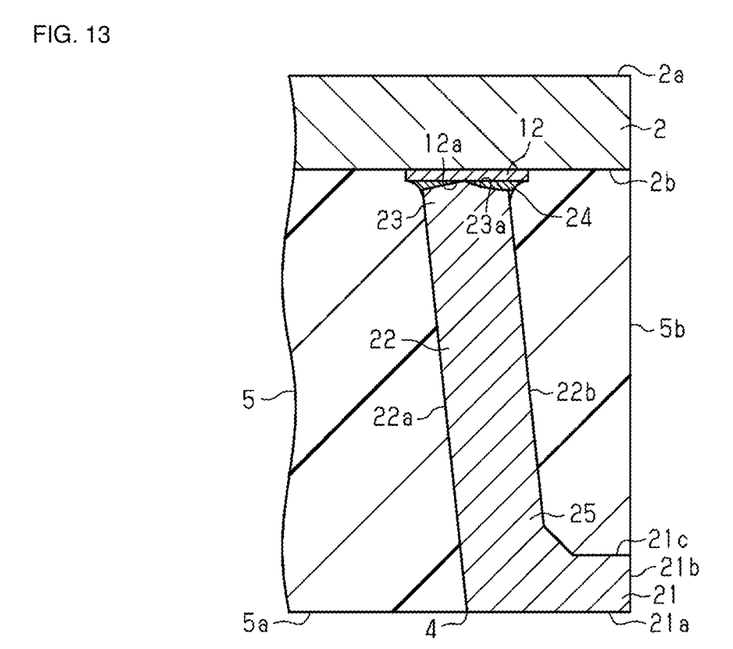
FIG. 13 is an enlarged cross-sectional view of surroundings of a lead in an electronic module according to another variation of a preferred embodiment of the present invention.

In the above-described preferred embodiment, the tip end surface 23a is tilted with respect to the bonding surface 12a such that the thickness of the solder 24 gradually increases in the direction from the side where the exposed section 21 is positioned toward the side opposite to the exposed section 21 in the tip end surface 23a. It is not limited thereto. As illustrated in FIG. 12, for example, the tip end surface 23a is tilted with respect to the bonding surface 12a such that the thickness of the solder 24 gradually increases in the direction from the side opposite to the exposed section 21 toward the side where the exposed section 21 is positioned in the tip end surface 23a. Not all of the tip end surface 23a may be tilted with respect to the bonding surface 12a. As illustrated in FIG. 13, for example, the tip end surface 23a may be configured such that the thickness of the solder 24 is the smallest at the center in the plate thickness direction of the main body section 22 in the tip end surface 23a and gradually increases toward the opposite sides in the plate thickness direction.

In the above-described preferred embodiment, the electronic module 1 may not include the heat sink 6.

In the above-described preferred embodiment, the solder 13 and 24 is used as the conductive binder. It is not limited thereto. Other binders, such as, for example, silver paste, may also be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic module comprising:
a wiring board including a principal surface on which an electrode pad including a bonding surface is located;
a lead electrically connected to the electrode pad with a conductive binder therebetween; and
a sealer to seal the lead; wherein
the lead includes:
an exposed section exposed to outside the sealer; and
a main body section extending from the exposed section toward the wiring board and including a tip end portion adjacent to or in a vicinity of the wiring board;
the tip end portion is connected to the electrode pad with the conductive binder therebetween;
a thickness of the conductive binder between a tip end surface of the tip end portion and the bonding surface of the electrode pad in a direction orthogonal or substantially orthogonal to the bonding surface is non-uniform; and
the tip end portion includes a cut region in a side surface of the main body section and in the tip end surface.

2. The electronic module according to claim 1, further comprising a plurality of electronic components mounted on the wiring board.

3. The electronic module according to claim 1, further comprising a heat sink embedded in the sealer.

4. The electronic module according to claim 3, wherein the heat sink is made of copper.

5. The electronic module according to claim 3, wherein the heat sink has an oblong plate shape smaller than the wiring board and includes leg sections radially extending from four corners of the heat sink.

6. The electronic module according to claim 1, wherein the wiring board is made of a resin material.

7. The electronic module according to claim 6, wherein the resin material is polychlorinated biphenyl.

8. The electronic module according to claim 1, wherein the wiring board is made of a ceramic material.

9. The electronic module according to claim 1, wherein the lead has a plate shape.

10. The electronic module according to claim 9, wherein the lead is made of copper.

11. The electronic module according to claim 1, wherein the sealer is made of epoxy resin.

12. An electronic module, comprising:
a wiring board including a principal surface on which an electrode pad including a bonding surface is located;
a lead electrically connected to the electrode pad with a conductive binder therebetween; and
a sealer to seal the lead; wherein
the lead includes:
an exposed section exposed to outside the sealer; and
a main body section extending from the exposed section toward the wiring board and including a tip end portion adjacent to or in a vicinity of the wiring board;
the tip end portion is connected to the electrode pad with the conductive binder therebetween;
a thickness of the conductive binder between a tip end surface of the tip end portion and the bonding surface of the electrode pad in a direction orthogonal or substantially orthogonal to the bonding surface is non-uniform;
the main body section extends in a direction tilted with respect to the bonding surface;
the exposed section is continuous with a base end portion of the main body section opposite to the principal surface and is bent at an obtuse angle to the main body section toward a side where the wiring board is positioned; and
the tip end surface is tilted with respect to the bonding surface such that the thickness of the conductive binder between the tip end surface and the bonding surface increases in a direction from a side where the exposed section is positioned toward a side opposite to the exposed section in the tip end surface.

13. The electronic module according to claim 12, wherein an angle between the bonding surface and the tip end surface is equal or substantially equal to an angle between the direction in which the main body section extends and a normal to the bonding surface.

14. The electronic module according to claim 12, wherein an angle between the direction in which the main body section extends and a normal to the bonding surface is 30 degrees or less.

15. The electronic module according to claim 12, further comprising a plurality of electronic components mounted on the wiring board.

16. The electronic module according to claim 12, further comprising a heat sink embedded in the sealer.

17. The electronic module according to claim 12, wherein the wiring board is made of a resin material.

18. The electronic module according to claim 12, wherein the wiring board is made of a ceramic material.

19. The electronic module according to claim 12, wherein the lead has a plate shape.

20. The electronic module according to claim 12, wherein the sealer is made of epoxy resin.

\* \* \* \* \*